(12) United States Patent
Teramoto et al.

(10) Patent No.: US 10,344,187 B2
(45) Date of Patent: Jul. 9, 2019

(54) POLISHING COMPOSITION AND POLISHING METHOD USING THE SAME

(71) Applicants: NITTA HAAS INCORPORATED, Osaka-shi, Osaka (JP); SUMCO CORPORATION, Minato-ku, Tokyo (JP)

(72) Inventors: Masashi Teramoto, Kyotanabe (JP); Shinichi Ogata, Tokyo (JP); Ryuichi Tanimoto, Tokyo (JP)

(73) Assignees: NITTA HAAS INCORPORATED, Osaka (JP); SUMCO CORPORATION, Tokyo (JP)

( * ) Notice: Subject to any disclaimer, the term of this patent is extended or adjusted under 35 U.S.C. 154(b) by 0 days.

(21) Appl. No.: 14/561,188

(22) Filed: Dec. 4, 2014

(65) Prior Publication Data

US 2015/0083962 A1 Mar. 26, 2015

Related U.S. Application Data

(62) Division of application No. 13/983,278, filed as application No. PCT/JP2012/052402 on Feb. 2, 2012, now abandoned.

(30) Foreign Application Priority Data

Feb. 3, 2011 (JP) ................................. 2011-022110

(51) Int. Cl.
| | | |
|---|---|---|
| *C09G 1/04* | (2006.01) | |
| *H01L 21/02* | (2006.01) | |
| *C09G 1/02* | (2006.01) | |
| *H01L 21/306* | (2006.01) | |

(52) U.S. Cl.
CPC ............... *C09G 1/04* (2013.01); *C09G 1/02* (2013.01); *H01L 21/02024* (2013.01); *H01L 21/30604* (2013.01)

(58) Field of Classification Search
USPC .................................. 216/88; 438/692; 7/88
See application file for complete search history.

(56) References Cited

U.S. PATENT DOCUMENTS

| | | | |
|---|---|---|---|
| 5,885,334 A | 3/1999 | Suzuki et al. | |
| 6,444,132 B1 | 9/2002 | Orii et al. | |
| 2003/0073385 A1 | 4/2003 | Benning et al. | |
| 2003/0082998 A1* | 5/2003 | Carter | C09G 1/02 451/41 |
| 2004/0092102 A1 | 5/2004 | Li et al. | |
| 2004/0134873 A1* | 7/2004 | Yao | C09G 1/02 216/2 |
| 2004/0224426 A1 | 11/2004 | Cooper et al. | |
| 2005/0054203 A1 | 3/2005 | Yamada | |
| 2005/0056810 A1 | 3/2005 | Bian et al. | |
| 2005/0070211 A1* | 3/2005 | Bian | H01L 21/3212 451/36 |
| 2005/0148291 A1* | 7/2005 | Ohashi et al. | 451/41 |
| 2006/0049143 A1 | 3/2006 | Sakamoto | |
| 2006/0111024 A1 | 5/2006 | Wang | |
| 2006/0163530 A1* | 7/2006 | Liu | C09G 1/02 252/79.1 |
| 2007/0093182 A1 | 4/2007 | Kollodge | |
| 2007/0184661 A1* | 8/2007 | Bian | H01L 21/3212 438/692 |
| 2007/0224101 A1* | 9/2007 | Ohta et al. | 423/335 |
| 2008/0149884 A1 | 6/2008 | Siddiqui et al. | |
| 2008/0263965 A1* | 10/2008 | Ohta | C09G 1/02 51/308 |
| 2008/0312382 A1 | 12/2008 | Kausch et al. | |
| 2009/0120457 A1* | 5/2009 | Naghshineh | C11D 3/3947 134/2 |
| 2009/0130849 A1* | 5/2009 | Lee | B24B 37/044 438/693 |
| 2009/0215265 A1* | 8/2009 | Thomas | C09G 1/02 438/692 |
| 2009/0215266 A1 | 8/2009 | Thomas et al. | |
| 2010/0159698 A1 | 6/2010 | McConnell et al. | |
| 2010/0176335 A1 | 7/2010 | Kim et al. | |
| 2010/0294983 A1 | 11/2010 | Matsushita et al. | |
| 2011/0121224 A1 | 5/2011 | Matsushita et al. | |
| 2012/0190200 A1* | 7/2012 | Penta et al. | 438/692 |

FOREIGN PATENT DOCUMENTS

| | | |
|---|---|---|
| JP | 9306881 A | 11/1997 |
| JP | 2008251939 A | 10/2008 |
| JP | 20103732 A | 1/2010 |
| TW | 200914596 A | 4/2009 |

OTHER PUBLICATIONS

Office Action dated Jan. 2, 2015, corresponding to U.S Appl. No. 13/983,278.
International Search Report dated Apr. 24, 2012 in International Application No. PCT/JP2012/052402.
Office Action dated Sep. 21, 2015, corresponding to U.S. Appl. No. 13/983,278.
Office Action dated Jul. 20, 2015, corresponding to Taiwanese patent application No. 101103569.
Office Action dated Apr. 30, 2015, corresponding to U.S. Appl. No. 13/983,278.
Office Action dated Nov. 18, 2015, corresponding to Taiwanese Patent Application No. 101103569.
Office Action in JP Application No. 2012-555955, dated Jan. 19, 2016.
Office Action in U.S. Appl. No. 13/983,278, dated Mar. 2, 2017.
Office Action in U.S. Appl. No. 13/983,278, dated Aug. 4, 2017.
Office Action in U.S. Appl. No. 13/983,278, dated Nov. 22, 2017, 11pp.
Office Action in KR Application No. 10-2013-7021964, dated Mar. 28, 2018, 9pp.
Office Action in U.S. Appl. No. 13/983,278, dated Apr. 11, 2018, 13pp.

\* cited by examiner

*Primary Examiner* — Shamim Ahmed

(74) *Attorney, Agent, or Firm* — Hauptman Ham, LLP

(57) ABSTRACT

Provided is a polishing composition that does not contain abrasives and that is used for polishing a silicon wafer, the polishing composition including a pH buffer, a polishing accelerator, a water-soluble polymer, and a block-type compound. By polishing a silicon wafer by using the polishing composition, a polishing speed of greater than 0.1 μm/min can be achieved.

6 Claims, 4 Drawing Sheets

Concentration of ethylene diamine tetrapolyoxyethylene polyoxypropylene(ppm)

Concentration of ethylene diamine tetrapolyoxyethylene polyoxypropylene(ppm)

POLISHING COMPOSITION AND POLISHING METHOD USING THE SAME

RELATED APPLICATIONS

The present application is a divisional application of application Ser. No. 13/983,278, filed Oct. 11, 2013, which is a National Phase of International Application Number PCT/JP2012/052402, filed Feb. 2, 2012, and claims priority from Japanese Application Number 2011-022110, filed Feb. 3, 2011. The contents of all of the above-listed prior-filed applications are incorporated by reference herein in their entirety.

TECHNICAL FIELD

The present invention relates to a polishing composition for polishing a silicon wafer, and a polishing method using the same.

BACKGROUND ART

Conventionally, multi-stage polishing has been performed generally in the polishing of a silicon wafer. More specifically, the following multi-stage polishing has been performed: a silicon wafer is flattened in the primary polishing, and the surface of the silicon wafer is finished more finely in the secondary polishing and subsequent stages.

In the primary polishing, a high polishing rate is required and flatness of a silicon wafer is demanded. The conventional polishing composition for the primary polishing contains abrasives in order to improve the polishing rate. As the abrasives, nanometer-order colloidal particles or the like are used.

In recent years, as the required accuracy regarding wafer quality increases, the prevention and countermeasure to scratches and LPDs (light point defects) come to be needed in the primary polishing as well.

The mechanical polishing with a polishing composition containing abrasives makes it possible to achieve a high polishing rate, but at the same time, it can be a factor that causes scratches and LPDs.

In considering how to suppress the generation of scratches and reduce LPDs, abrasives have attracted attention, and an abrasive-free polishing composition A for polishing a silicon wafer has been known (Patent Document 1). This polishing composition A is composed of an alkaline aqueous solution that contains a water-soluble silicic acid component and an alkaline component and has a pH of 8.5 to 13.

This polishing composition A is used in a polishing process performed after the polishing of a silicon wafer with a polishing composition B that contains abrasives. In other words, in the two-stage polishing with respect to a silicon wafer, the polishing composition A is used in the latter stage thereof. Therefore, the polishing with a substantially abrasive-free polishing composition has not been realized yet. Further, as a high polishing pressure of about 300 gf/cm$^2$, which is used generally, is required in order to achieve a higher polishing rate, problems arise such as an increase in scratches, and wafer deformation such as edge roll-off. Still further, the polishing under a high polishing pressure involves an increase in the polishing temperature, which causes the reaction of chemical components to increase locally. This leads to problems in the flatness, such as irregularities in the wafer inplane thickness.

In addition, in the multi-stage polishing of a silicon wafer, major challenges in the polishing in latter stages are the elimination and reduction of roughness on the smaller levels, scratches, nanometer-order defects, and LPDs.

Patent Document 1: JP9(1997)-306881A

DISCLOSURE OF INVENTION

In the primary polishing of a silicon wafer, however, if the polishing is carried out with a composition without abrasives, mechanical polishing effects degrade generally, which leads to a problem of a decrease in the polishing rate. Besides, there is a problem that Haze and LPDs vary significantly in polished wafers.

The present invention, therefore, was made in order to address such problems, and an object of the present invention is to provide a polishing composition that does not contain abrasives and that allows a polishing rate applicable to the primary polishing of a silicon wafer.

Another object of the present invention is to provide a polishing method using a polishing composition that does not contain abrasives and that allows a polishing rate applicable to the primary polishing of a silicon wafer.

According to the present invention, the polishing composition is a polishing composition that does not contain abrasives and that is used for polishing a silicon wafer, and the polishing composition contains a polishing accelerator, a water-soluble polymer, and a block-type compound in which an oxyethylene group and an oxypropylene group are included in a block-type polyether. The polishing accelerator includes an amine compound or an inorganic alkaline compound.

Further, according to the present invention, the polishing method is a polishing method for polishing a silicon wafer using the polishing composition according to claim 1 or 2.

According to an embodiment of the present invention, the polishing composition is a polishing composition that does not contain abrasives and that is used for polishing a silicon wafer, and the polishing composition contains a polishing accelerator, a water-soluble polymer, and a block-type compound. As a result, when a silicon wafer is polished with the polishing composition, a polishing speed of greater than 0.1 µm/min can be achieved.

Further, the effects of the water-soluble polymer and the block-type compound can reduce Haze and LPDs. Particularly, the block-type compound has a hydrophilic group and a hydrophobic group in one polymer chain, and has a smaller molecular weight as compared with coexistent water-soluble polymers, thereby having a smaller steric size in a molecular chain and in a solution. The block-type compound, therefore, adsorbs to a surface of a silicon wafer at a higher adsorption rate and is unlikely to cause steric hindrance, thereby being able to bond to a surface of a silicon wafer at a high density. Further, regarding a block copolymer having a hydrophilic group and a hydrophobic group, a surface of a silicon wafer immediately after polishing, that is, highly reactive silicon, quickly forms a bond with a hydrophilic group of the block copolymer; and in contrast, the hydrophobic portion thereof can be positioned on the surface of the silicon wafer after the molecule chain adsorbs thereto, so as to prevent foreign materials present under the polishing environments from adsorbing thereto. Still further, a water-soluble polymer forms a steric polymer chain that includes a water molecule via a hydrogen bond, thereby being able to keep the surface of the silicon wafer hydrophilic. As the water-soluble polymer and the block-type compound both are included, better effects can be achieved as compared with the case where either of the foregoing two is used alone.

Therefore, the polishing composition according to the embodiment of the present invention can be applied to the primary polishing of a silicon wafer.

DESCRIPTION OF THE INVENTION

Figure 1:
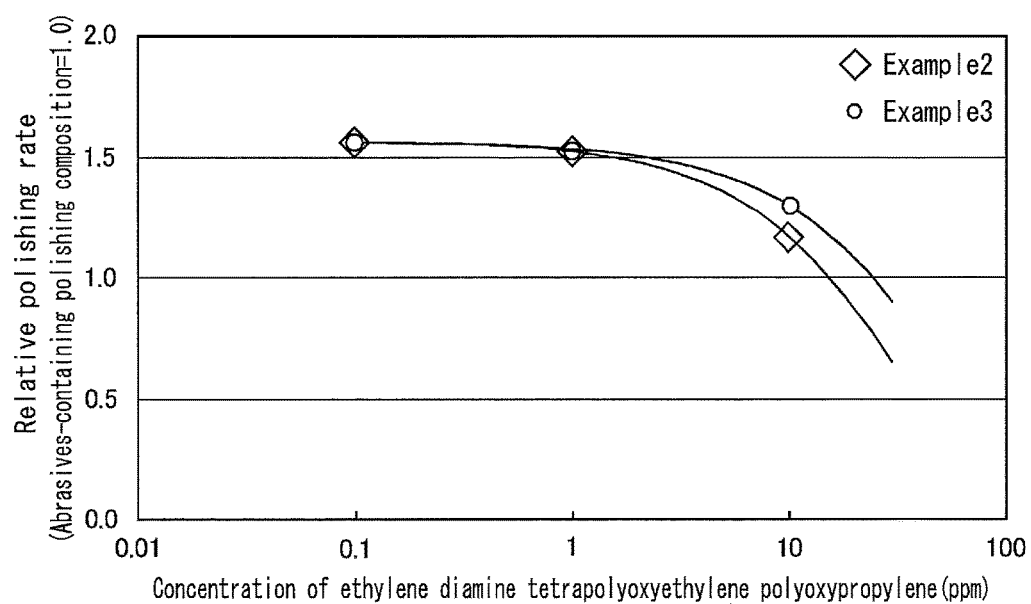
FIG. 1 shows a relationship between a relative polishing rate and concentration of a block-type compound.

An embodiment of the present invention is explained in detail, with reference to the drawings. It should be noted that the same or equivalent parts in the drawings are denoted by the same reference numerals, and descriptions of the same are not repeated.

In the present specification, the term "silicon wafer" is used when explanation relating to polishing is made, and the term "silicon" is used when explanation relating to chemical reaction is made.

A polishing composition COMP1 according to the embodiment of the present invention is a polishing composition that does not contain abrasives and that is used for polishing a silicon wafer. The polishing composition COMP1 contains a pH buffer, a polishing accelerator, a water-soluble polymer, and a compound that includes an alkyl amine structure having two nitrogen atoms, the alkyl amine structure being expressed as the general formula (1) shown below, and that includes at least one block-type polyether bonded either of the two nitrogen atoms of the alkyl amine structure, wherein an oxyethylene group and an oxypropylene group are included in the block-type polyether.

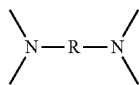

[Chemical Formula 1]

It should be noted that in an embodiment of the present invention, the compound where an oxyethylene group and an oxypropylene group are included in the block-type polyether is referred to as a "block-type compound".

The polishing composition COMP1 is used for polishing a silicon wafer having a oxide layer formed on surfaces thereof, that is, for primary polishing of a silicon wafer. Further, the polishing composition COMP1 is used for single-side polishing of a silicon wafer, or for double-side polishing of a silicon wafer.

The pH buffer contains, for example, a carbonate and a hydrogencarbonate. With regard to the buffering effects, the carbonate and the hydrogencarbonate may be mixed when used, or each may be used alone. The carbonate is formed with a carbonate of a monovalent ion such as an alkali metal element; for example, it is formed with any one of potassium carbonate and sodium carbonate. Further, examples of the carbonate include the following: carbonates of a bivalent metal ion such as alkali earth metal elements; and carbonates formed with a nitrogen group and an organic compound, such as ammonium salts and amine carbonate salts. Examples of the amine carbonate salt include guanidine carbonate salts, aminoguanidine bicarbonate salts, and biguanide carbonate salts. Further, examples of the hydrogencarbonate, like the carbonate, include salts of inorganic compounds and organic compounds, such as salts of alkali and alkali earth metals, ammonium salts, and salts of amine compounds. For example, a hydrogencarbonate compound of a monovalent alkali metal is formed with either one of potassium hydrogencarbonate and sodium hydrogencarbonate.

The pH buffer includes a carbonate and a hydrogencarbonate. The carbonate is formed with a carbonate of a monovalent ion, for example, either one of potassium carbonate and sodium carbonate. The hydrogencarbonate is formed with a hydrogencarbonate of a monovalent ion, for example, either one of potassium hydrogencarbonate and sodium hydrogencarbonate.

The polishing accelerator is formed with an amine compound or an inorganic alkaline compound. In the embodiment of the present invention, the amine compound encompasses primary amine to quaternary amine that include nitrogen groups. The amine compound is formed with an amine having 1 to 6 carbon atoms, for example, 2-(2-aminoethylamino)ethanol. This is because an amine having more than 6 carbon atoms causes the polishing accelerator to have a lower ability for forming a complex with silicon, thereby causing effects per unit concentration to degrade.

The inorganic alkaline compound is formed with, for example, potassium hydroxide.

The water-soluble polymer is formed with a polymer compound having a cellulose structure, for example, hydroxyethyl cellulose. Further, the water-soluble polymer is formed with a nonionic polymer compound, for example, any one of polyvinyl alcohol, polyacrylamide, polyvinylpyrrolidone, polyethylene glycol, polypropylene glycol, and polyethylene oxide.

The block-type compound is formed with a block-type compound in which an oxyethylene group and an oxypropylene group have hydrophilic and hydrophobic groups in one polymer chain of block-type polyether; for example, it is formed with ethylene diamine tetrapolyoxyethylene polyoxypropylene.

The polishing composition COMP1 is produced by appropriately mixing the pH buffer, the polishing accelerator, the water-soluble polymer, and the block-type compound, and then, adding water thereto. Alternatively, the polishing composition COMP1 is produced by sequentially mixing the following into water: the pH buffer; the polishing accelerator; the water-soluble polymer; and the block-type compound. As a means for mixing these components, a means normally used in the technical field of the polishing composition, such as a homogenizer and ultrasonic wave, are used.

Resulting from that the polishing composition COMP1 contains the above-described pH buffer, the polishing composition COMP1 is controlled to have a pH of 10.5.

In the embodiment of the present invention, the polishing composition COMP1 may further contain a chelating agent.

The chelating agent is formed with any one of the following: ethylene diamine tetraacetic acid (EDTA); hydroxyethyl ethylene diamine triacetic acid (HEDTA); diethylene triamine pentaacetic acid (DTPA); nitrilo triacetic acid (NTA); triethylene tetramine hexaacetic acid (TTHA); hydroxyethyl imino diacetic acid (HIDA); dihydroxy ethyl glycine (DHEG); ethylene glycol bis(2-aminoethylether) tetraacetic acid (EGTA); and 1,2-cyclohexane diamine tetraacetic acid (CDTA). Further, the chelating agent is formed with at least one type of a chemical compound, selected from the group consisting of substituents and derivatives of these compounds. Still further, the chelating agent may be formed with an organic acid, for example, any one of the following: potassium sodium tartrate; potassium tartrate; citric acid; trisodium citrate; monosodium citrate; tripotassium citrate; lactic acid; and DL-malic acid.

The chelating agent prevents a silicon wafer to be polished from being contaminated by metals. Further, the chelating agent only contributes to the prevention of metal contamination, and basically does not influence the improvement of the polishing rate, the surface roughness of a silicon wafer, etc. However, the pH of the polishing composition varies with the concentration of the chelating agent. The chelating agent, therefore, functions as a pH adjuster in some cases.

Hereinafter, the present invention is explained in detail by way of examples.

Components of a polishing composition and a polishing rate in Example 1 are shown in Table 1.

TABLE 1

|  | Example 1 |
| --- | --- |
| pH buffer | $K_2CO_3$: 4.75 wt % |
|  | $KHCO_3$: 1.15 wt % |
| Polishing accelerator | 2-(2-aminoethylamine)ethanol: 0.50 wt % |
| Water-soluble polymer | HEC: 0.025 wt % |

TABLE 1-continued

|  | Example 1 |
| --- | --- |
| Block-type compound | ethylene diamine tetrapolyoxyethylene polyoxypropylene: 0.025 wt % |
| Chelating agent | DTPA: 0.375 wt % |
| Polishing rate (μ/min) | 0.14 to 0.15 |

HEC: hydroxyethyl cellulose
DTPA: diethylene triamine pentaacetic acid

The polishing composition of Example 1 contains 4.75 wt % of $K_2CO_3$, 1.15 wt % of $KHCO_3$, 0.50 wt % of 2-(2-aminoethylamine)ethanol, 0.025 wt % of hydroxyethyl cellulose (HEC), 0.025 wt % of ethylene diamine tetrapolyoxyethylene polyoxypropylene, and 0.375 wt % of diethylene triamine pentaacetic acid.

The polishing composition of Example 1 contains two types of pH buffers.

Evaluation of Polishing Speed

Using a polishing device (DSM20B-5P-4D) (manufactured by SpeedFam Co., Ltd.), double-side polishing was performed in the following manner: while 25-fold dilution of the polishing composition of Example 1 was supplied at a rate of 5.0 liter/min to a polishing pad (urethane pad (manufactured by Nitta Haas Incorporation)) and a pressure of 175 (g/cm$^2$) was applied to a silicon wafer having a diameter of 300 mm, the upper platen and the lower platen of the polishing platens were rotated at rotation speeds of −11.9 rpm and 35.0 rpm, respectively, and the carrier was rotated at a rotation speed of −8.3 rpm. This double-side polishing was performed for 30 to 120 minutes.

After the polishing completed, a decrease in the thickness of the silicon wafer through removal by the polishing was measured by "NANOMETRO 300TT", a wafer flatness measurement device manufactured by Kuroda Precision Industries. The polishing speed was evaluated according to a decreased in the thickness of the silicon wafer caused through the removal by the polishing per unit time (μm/min).

As shown in Table 1, the polishing speed in the case where the polishing composition of Example 1 was used was 0.14 to 0.15 (μm/min), which is greater than 0.1 (μm/min).

As described above, a polishing speed greater than 0.1 (μm/min) can be achieved by using the polishing composition COMP1 for polishing a silicon wafer.

Therefore, the polishing composition COMP1 can be applied to primary polishing of a silicon wafer.

Components of polishing compositions in Examples 2 and 3 are shown in Table 2.

TABLE 2

|  | Example 2 | Example 3 |
| --- | --- | --- |
| pH buffer | $K_2CO_3$: 0.200 wt % | $K_2CO_3$: 0.200 wt % |
|  | $KHCO_3$: 0.050 wt % | $KHCO_3$: 0.050 wt % |
| Polishing accelerator | 2-(2-aminoethylamine)ethanol: 0.020 wt % | 2-(2-aminoethylamine)ethanol: 0.020 wt % |
| Water-soluble polymer | HEC { Weight average molecular weight (Mw): 500,000 Concentration: 10 ppm | HEC { Weight average molecular weight (Mw): 1,300,000 Concentration: 10 ppm |
| Block-type compound | ethylene diamine tetrapolyoxyethylene polyoxypropylene: 0.1 to 10 ppm | ethylene diamine tetrapolyoxyethylene polyoxypropylene: 0.1 to 10 ppm |
| Chelating agent | DTPA: 0.015 wt % | DTPA: 0.015 wt % |

HEC: hydroxyethyl cellulose
DTPA: diethylene triamine pentaacetic acid

The polishing composition of Example 2 contains 0.200 wt % of $K_2CO_3$, 0.050 wt % of $KHCO_3$, 0.020 wt % of 2-(2-aminoethylamine)ethanol, hydroxyethyl cellulose (HEC) having a weight average molecular weight of 500,000 and a concentration of 10 ppm, 0.1 to 10 ppm of ethylene diamine tetrapolyoxyethylene polyoxypropylene, and 0.015 wt % of diethylene triamine pentaacetic acid.

The polishing composition of Example 3 contains 0.200 wt % of $K_2CO_3$, 0.050 wt % of $KHCO_3$, 0.020 wt % of 2-(2-aminoethylamine)ethanol, hydroxyethyl cellulose (HEC) having a weight average molecular weight of 1,300,000 and a concentration of 10 ppm, 0.1 to 10 ppm of ethylene diamine tetrapolyoxyethylene polyoxypropylene, and 0.015 wt % of diethylene triamine pentaacetic acid.

The polishing composition of Example 3 is the polishing composition of Example 2 modified by changing the weight average molecular weight of hydroxyethyl cellulose (HEC) from 500,000 (Mw) to 1,300,000 (Mw).

LPDs and Haze of silicon wafers after polishing were measured with LS6600 manufactured by Hitachi Electronic Engineering Co., Ltd. Regarding LPDs, those having a size greater than 130 nm and those having a size greater than 90 nm were counted.

FIG. 1 shows a relationship between a relative polishing rate and a concentration of the block-type compound. In FIG. 1, the vertical axis represents the relative polishing rate, and the horizontal axis represents the concentration of the block-type compound (i.e., ethylene diamine tetrapolyoxyethylene polyoxypropylene). Each white rhombus indicates a relative polishing rate in the case where the polishing composition of Example 2 was used, and each white circle indicates a relative polishing rate in the case where the polishing composition of example 3 was used.

It should be noted that the "relative polishing rate" indicates a polishing rate in the case where the polishing rate achieved when the polishing composition containing abrasives is used is assumed to be 1.0. The polishing composition containing abrasives contains 5 wt % of colloidal silica, 0.06 wt % of potassium hydroxide (KOH), and ethylene diamine tetraacetic acid (EDTA), and had a pH of 11.2.

Referring to FIG. 1, the relative polishing rate was greater than 1.0 in the entire concentration range of 0.1 to 10 ppm of the block-type compound. In other words, the polishing rates in the case where the polishing compositions of Examples 2 and 3 were used were greater than the polishing rate in the case where the polishing composition containing abrasives was used.

Figure 2:
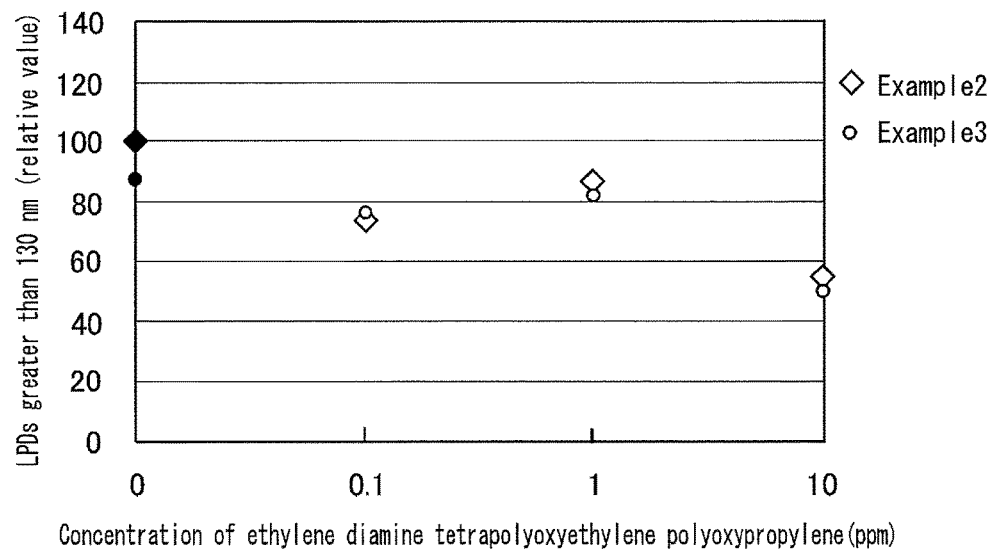
FIG. 2 shows a relationship between LPDs and concentration of a block-type compound.

FIG. 2 shows a relationship between LPDs and the concentration of the block-type compound. In FIG. 2, the vertical axis represents LPDs greater than 130 nm, and the horizontal axis represents the concentration of the block-type compound (i.e., ethylene diamine tetrapolyoxyethylene polyoxypropylene). Further, each white rhombus indicates a relationship between LPDs greater than 130 nm and the concentration of the block-type compound in the case where the polishing composition of Example 2 was used, and each white circle indicates a relationship between LPDs greater than 130 nm and the concentration of the block-type compound in the case where the polishing composition of Example 3 was used. Still further, the black rhombus indicates LPDs greater than 130 nm when the concentration of the block-type compound was set to 0 ppm in the polishing composition of Example 2, and the black circle indicates LPDs greater than 130 nm when the concentration of the block-type compound was set to 0 ppm in the polishing composition of Example 3.

It should be noted that regarding the LPDs greater than 130 nm indicated in FIG. 2, the indications are made with reference to LPDs (i.e., LPDs indicated by the black rhombus) greater than 130 nm when the concentration of the block-type compound was set to 0 ppm in the polishing composition of Example 2.

Referring to FIG. 2, LPDs greater than 130 nm in the case where the polishing compositions of Examples 2 and 3 were used, when the concentration of the block-type compound was 1 to 10 ppm, were reduced as compared with the case where the concentration of the block-type compound was 0 ppm.

Figure 3:
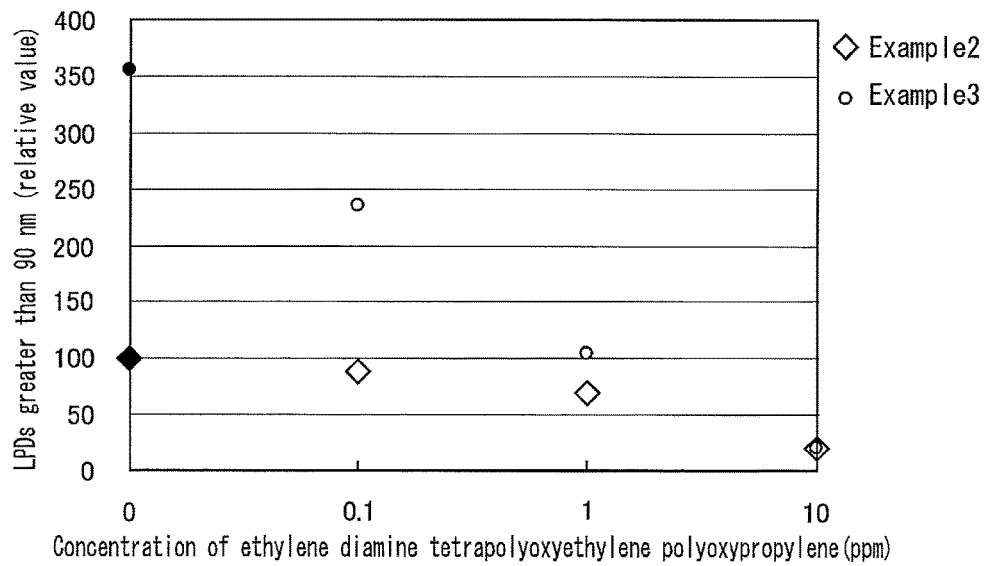
FIG. 3 shows another relationship between LPDs and concentration of a block-type compound.

FIG. 3 shows another relationship between LPDs and the concentration of the block-type compound. In FIG. 3, the vertical axis represents LPDs greater than 90 nm, and the horizontal axis represents the concentration of the block-type compound (i.e., ethylene diamine tetrapolyoxyethylene polyoxypropylene). Further, each white rhombus indicates a relationship between LPDs greater than 90 nm and the concentration of the block-type compound when the polishing composition of Example 2 was used. Each white circle indicates a relationship between LPDs greater than 90 nm and the concentration of the block-type compound when the polishing composition of Example 3 was used. Further, the black rhombus indicates LPDs greater than 90 nm when the concentration of the block-type compound was set to 0 ppm in the polishing composition of Example 2. The black circle indicates LPDs greater than 90 nm when the concentration of the block-type compound was set to 0 ppm in the polishing composition of Example 3.

It should be noted that regarding the LPDs greater than 90 nm, the indications are made with reference to LPDs (i.e., LPDs indicated by the black rhombus) greater than 90 nm when the concentration of the block-compound was set to 0 ppm in the polishing composition of Example 2.

Referring to FIG. 3, LPDs greater than 90 nm in the case where the polishing compositions of Examples 2 and 3 were used, when the concentration of the block-type compound was 1 to 10 ppm, were reduced as compared with the case where the concentration of the block-type compound was 0 ppm.

Figure 4:
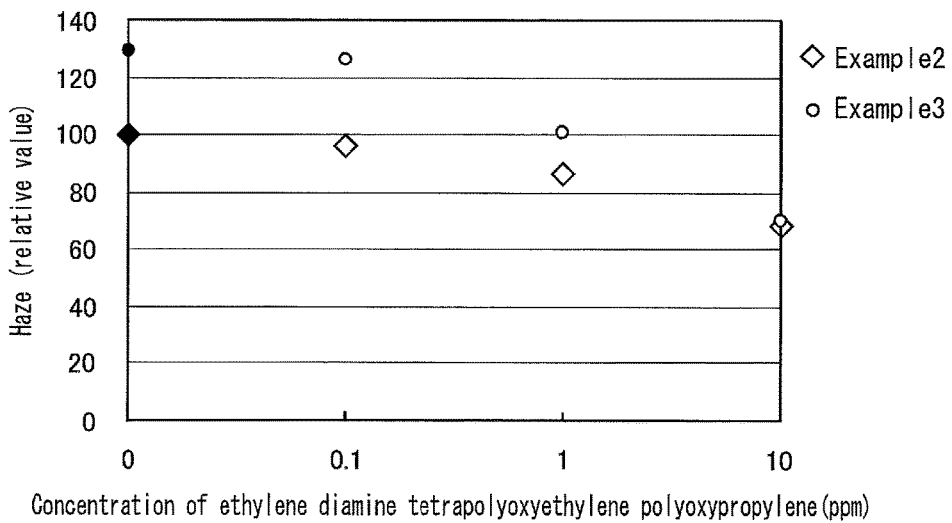
FIG. 4 shows a relationship between Haze and concentration of a block-type compound.

FIG. 4 shows a relationship between Haze and the concentration of the block-type compound. In FIG. 4, the vertical axis represents Haze (relative value), and the horizontal axis represents the concentration of the block-type compound (i.e., ethylene diamine tetrapolyoxyethylene polyoxypropylene). Further, each white rhombus indicates a relationship between Haze (relative value) and the concentration of the block-type compound in the case where the polishing composition of Example 2 was used, and each white circle indicates a relationship between Haze (relative value) and the concentration of the block-type compound in the case where the polishing composition of Example 3 was used. Still further, the black rhombus indicates Haze (relative value) when the concentration of the block-type compound was set to 0 ppm in the polishing composition of Example 2, and the black circle indicates Haze (relative value) when the concentration of the block-type compound was set to 0 ppm in the polishing composition of Example 3.

It should be noted that regarding Haze, the indications are made with reference to Haze (i.e., haze indicated by the black rhombus) when the concentration of the block-type compound was set to 0 ppm in the polishing composition of Example 2.

Referring to FIG. 4, Haze in the case where the polishing compositions of Examples 2 and 3 were used, when the concentration of the block-type compound was 1 to 10 ppm, was reduced as compared with the case where the concentration of the block-type compound was 0 ppm.

Therefore, it is preferable that the concentration of the block-type compound is in the range of 1 to 10 ppm.

Figure 5:
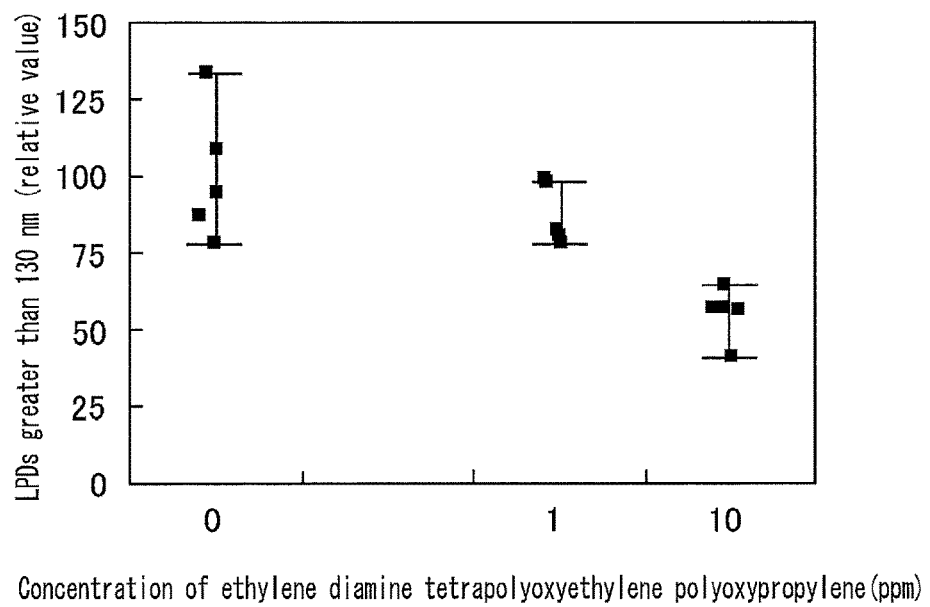
FIG. 5 shows a relationship between distribution of LPDs and concentration of a block-type compound.

FIG. 5 shows a relationship between the distribution of LPDs and the concentration of the block-type compound. In FIG. 5, the vertical axis represents LPDs greater than 130 nm, and the horizontal axis represents the concentration of the block-type compound (i.e., ethylene diamine tetrapolyoxyethylene polyoxypropylene). Further, each black square indicates a relationship between LPDs greater than 130 nm and the concentration of the block-type compound in the case where the polishing composition of Example 2 was used. Still further, ranges indicated by straight lines in FIG. 5 indicate ranges of distribution of LPDs.

Referring to FIG. 5, the distribution of LPDs greater than 130 nm became smaller when the concentration of the block-type compound (i.e., ethylene diamine tetrapolyoxyethylene polyoxypropylene) was increased to 1 to 10 ppm.

Figure 6:
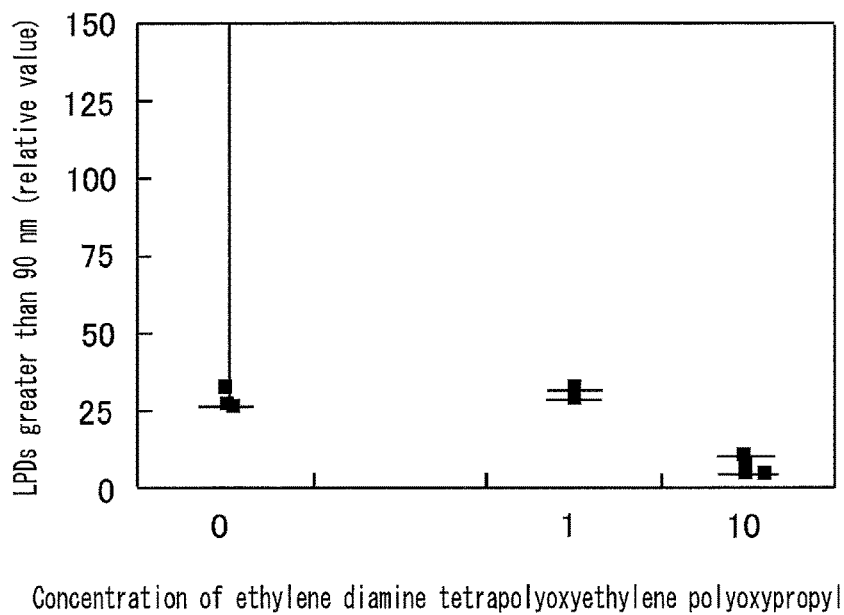
FIG. 6 shows another relationship between distribution of LPDs and concentration of a block-type compound.

FIG. 6 shows another relationship between the distribution of LPDs and the concentration of the block-type compound. In FIG. 6, the vertical axis represents LPDs greater than 90 nm, and the horizontal axis represents the concentration of the block-type compound (i.e., ethylene diamine tetrapolyoxyethylene polyoxypropylene). Further, each black square indicates a relationship between LPDs greater than 90 nm and the concentration of the block-type compound in the case where the polishing composition of Example 3 was used. Still further, ranges indicated by straight lines in FIG. 6 indicate ranges of distribution of LPDs.

Referring to FIG. 6, the distribution of LPDs greater than 90 nm became significantly smaller when the concentration of the block-type compound (i.e., ethylene diamine tetrapolyoxyethylene polyoxypropylene) was increased to 1 to 10 ppm.

Figure 7:
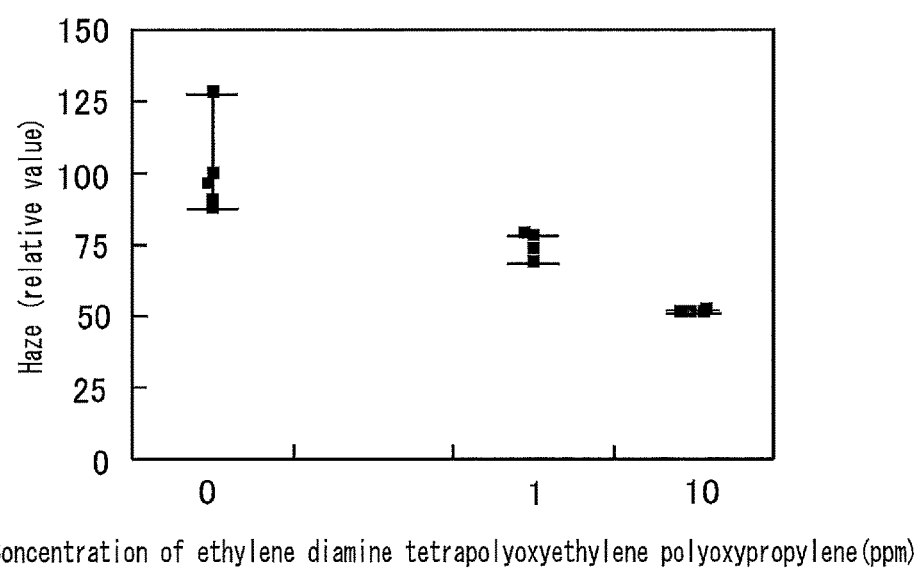
FIG. 7 shows a relationship between distribution of Haze and concentration of a block-type compound.

FIG. 7 shows a relationship between distribution of Haze and the concentration of the block-type compound. In FIG. 7, the vertical axis represents Haze (relative value), and the horizontal axis represents the concentration of the block-type compound (i.e., ethylene diamine tetrapolyoxyethylene polyoxypropylene). Further, each black square indicates a relationship between Haze and the concentration of the block-type compound in the case where the polishing composition of Example 3 was used. Still further, ranges indicated by straight lines in FIG. 7 indicate ranges of distribution of Haze.

Referring to FIG. 7, the distribution of haze became significantly smaller when the concentration of the block-type compound (i.e., ethylene diamine tetrapolyoxyethylene polyoxypropylene) was increased to 1 to 10 ppm.

Thus, the distribution of LPDs and the distribution of Haze can be reduced by increasing the concentration of the block-type compound (i.e., ethylene diamine tetrapolyoxyethylene polyoxypropylene) to 1 to 10 ppm.

The polishing composition COMP1 described above contains a pH buffer, but in the case where the polishing composition COMP1 is not circulated, the polishing composition COMP1 does not have to contain a pH buffer.

In the case where the polishing composition COMP1 is circulated, the pH of the polishing composition supplied to a surface of a silicon wafer varies with time. The polishing composition COMP1, therefore, contains a pH buffer in the case where the polishing composition COMP1 is circulated.

Therefore, the polishing composition COMP1 contains a pH buffer in the case where the polishing composition COMP1 is circulated, and does not contain a pH buffer in the case where the polishing composition COMP1 is not circulated.

It should be noted that in the embodiment of the present invention, the block-type compound does not have to include an alkylamine structure having two nitrogen atoms as expressed by the general formula (1) shown above, and may be any chemical compound as long as it is a compound in which an oxyethylene group and an oxypropylene group are included in a block-type polyether.

The embodiment thus disclosed herein should be considered illustrative, and not limiting, in every respect. The scope of the present invention is intended to be indicated by claims, not by the foregoing description of the embodiment, and to include meanings equivalent to the scope of claims and all modifications within the scope.

INDUSTRIAL APPLICABILITY

The present invention is applicable to a polishing composition used for polishing a silicon wafer, and to a polishing method using the same.

The invention claimed is:

1. A polishing method of polishing a silicon wafer, the method comprising:
   using a polishing composition to polish the silicon wafer at a polishing rate greater than 0.1 μm/min, wherein the polishing composition does not contain abrasives and comprises:
   a polishing accelerator including an amine compound having 1 to 6 carbon atoms;
   a water-soluble polymer; and
   a compound that includes an alkyl amine structure and at least one block polyether, wherein an oxyethylene group and an oxypropylene group are included in the block polyether,
   wherein the compound has a hydrophilic group and a hydrophobic group in one polymer chain, and has a smaller molecular weight as compared with coexistent water-soluble polymers, and
   a concentration of the compound is 0.1 to 10 ppm.

2. The polishing method according to claim 1, wherein the polishing composition further comprises:
   a pH buffer including a carbonate and a hydrogencarbonate.

3. The polishing method according to claim 1, wherein the alkyl amine structure having two nitrogen atoms.

4. The polishing method according to claim 1, wherein a weight average molecular weight of the water-soluble polymer is between 500,000 and 1,300,000.

5. The polishing method according to claim 1, wherein the polishing accelerator is 2-(2-aminoethylamino) ethanol.

6. The polishing method according to claim 1, wherein the polishing is a primary polishing of a silicon wafer.

* * * * *